United States Patent [19]

Rostoker

[11] Patent Number: 5,662,768
[45] Date of Patent: Sep. 2, 1997

[54] HIGH SURFACE AREA TRENCHES FOR AN INTEGRATED CIRUIT DEVICE

[75] Inventor: Michael D. Rostoker, Boulder Creek, Calif.

[73] Assignee: LSI Logic Corporation, Milpitas, Calif.

[21] Appl. No.: 531,659

[22] Filed: Sep. 21, 1995

[51] Int. Cl.$^6$ .................................................. H01L 21/00
[52] U.S. Cl. ............................ 257/301; 216/39; 216/62; 216/87; 257/905; 438/386; 438/701; 438/705
[58] Field of Search ........................... 156/643.1, 657.1, 156/628.1, 651.1; 216/17, 39, 62, 87; 437/52, 65, 72, 919; 257/905, 906, 908, 301, 390

[56] References Cited

U.S. PATENT DOCUMENTS

| | | |
|---|---|---|
| 4,208,241 | 6/1980 | Harshbarger et al. . |
| 4,533,430 | 8/1985 | Bower .................... 156/651.1 X |
| 4,916,511 | 4/1990 | Douglas . |
| 4,948,458 | 8/1990 | Ogle . |
| 5,155,657 | 10/1992 | Oehrlein et al. ................. 437/52 X |
| 5,449,630 | 9/1995 | Lur et al. ......................... 437/927 X |

OTHER PUBLICATIONS

Carter, B.J., Holland, J.P., Peltzer, E., Richardson, B., Bogle, E., Nguyen, H.T., Melaku, Y., Gates, D., and Ben–Dor, M., "Transformer Coupled Plasma Etch for the Fabrication of Sub–half Micron Structures", Abstract #967, Lam Research Corporation, Fremont, CA, 1992.

Singer, Peter, "Electrostatic Chucks in Wafer Processing", pp. 57–64, Semiconductor International, Apr. 1995.

"Texas Instruments TMX416100DZ 16–Megabit DRAM", Integrated Circuit Engineering Corporation, Report No. SUB 918–03, pp. 1–18, Aug. 1991.

"Hitachi HM51W64800J7 64 MBit DRAM", Integrated Circuit Engineering Corporation, Report No. SUB 9407–04, pp. 1–12, Jul. 1994.

"Hitachi HM5116100J8 16–Megabit DRAM", Integrated Circuit Engineering Corporation, Report No. SUB 9204–02, pp. 1–18, Apr. 1992.

Primary Examiner—William Powell
Attorney, Agent, or Firm—Hickman Beyer & Weaver

[57] ABSTRACT

A process is disclosed for forming trenches having high surface-area sidewalls with undulating profiles. Such trenches are formed by first implanting multiple vertically separated layers of dopant in a substrate beneath a region where the trench is to be formed. Next, the trench is formed under conditions chosen to selectively attack highly doped substrate regions (i.e., substrate regions where the dopant has been implanted). The resulting trench sidewalls will have undulations corresponding to the positions of the implanted regions. In one case, the implanted layers contain germanium ions, and a trench is aniostropically etched through the layers of germanium. Thereafter, the trench is subjected to oxidizing conditions to form regions of germanium oxide. Finally, the trench is exposed to an aqueous solvent which dissolves germanium oxide, disrupting the silicon lattice, and leaving gaps or undulations in the sidewall.

37 Claims, 4 Drawing Sheets

HIGH SURFACE AREA TRENCHES FOR AN INTEGRATED CIRUIT DEVICE

BACKGROUND OF THE INVENTION

The present invention relates generally to methods of forming trenches in wafers during fabrication of integrated circuits ("ICs"). More particularly, the invention relates to methods of forming high surface area trenches by etching through a substrate having chemically distinct strata.

Trenches in semiconductor substrates may serve various functions in integrated circuits. For example, trenches may electrically isolate MOS devices from one another on integrated circuits. They may also serve as part of a capacitor in "trench capacitor type" dynamic random access memory chips ("DRAMs"). In such DRAMs, each trench capacitor stores a single bit which may be either a 1 or a 0 depending upon whether the capacitor is charged or uncharged.

Trenches are particularly attractive for such applications because they utilize a substrate's third dimension (i.e., the direction normal to the substrate surface), and therefore occupy only very little area on the top surface of the substrate. While other structures for device isolation and capacitor formation can provide somewhat densely packed devices, trench-based structures generally require even less chip area. For example, when trenches are used for device isolation, they occupy far less area than the other commonly used major isolation structure: field oxides. Further, when trenches are used as capacitors in DRAMs, the trench capacitors occupy less substrate surface area than most other DRAM capacitor types (e.g., planar and stacked capacitors).

While trenches provide space saving advantages for certain applications, further improvements in device density may require trenches of increasing surface area. This is particularly true for trench capacitors in DRAM applications because each trench capacitor of a DRAM must be capable of storing a certain minimum amount of charge in order to ensure that information is not lost between refresh cycles. As the mount of stored charge in a trench type capacitor is directly proportional to the surface area of the trench itself, any surface area lost in narrowing the trench must be made up elsewhere. More generally, the capacitance of the trench capacitor must be maintained even as device sizes and spacing between devices decrease.

The capacitance of a trench capacitor may be increased in three ways. First, as noted, it may be increased by increasing the surface area of the capacitor plates (e.g., the trench walls). Second, it may be increased by increasing the dielectric constant of an insulator separating the plates, and finally, it may be increased by reducing the thickness of the insulator. While some work has focused on engineering trench dielectrics to be thinner dielectrics or have higher dielectric constants, such efforts are not particularly relevant to the invention described herein.

Some effort has focused on making narrow trench capacitors deeper so as to provide increased surface area. While this approach has yielded some improvements in device density, it is believed that to develop 64 megabit or greater trench-type DRAMs, trenches having submicron widths and aspect ratios of at least about 2.5 to 1 (depth to width) must be formed. However, trench capacitors in current 16 megabit DRAMs produced by Texas Instruments Corporation have widths of about 1.5 µm and depths of only about 2.85 µm. Unfortunately, available trench forming techniques have not yet proved able to reliably attain submicron trenches of the depth to width ratios necessary to reach the 64 megabit requirements.

Conventionally, trenches are formed by etching a masked substrate in a plasma reactor of some sort. Reactor conditions are chosen to produce anisotropic etching (i.e., etching that is primarily vertical, without significant lateral undercutting). The resulting trench has straight sidewalls extending vertically or nearly vertically down into the substrate (e.g., between about 80° to 90°). Conditions promoting such trenches include low reactor pressure, high bias for directing charged plasma species toward the substrate, and etch chemistries that provide protections of sidewalls.

Copending patent applications Ser. No. 08/531,727 (attorney docket no. LSI1PO36/P2585) entitled "INTEGRATED CIRCUIT DEVICE FABRICATION BY PLASMA ETCHING" and Ser. No. 08/531,473 (attorney docket no. LSI1PO33/P2586) entitled "INTEGRATED CIRCUIT DEVICE FABRICATION BY PLASMA ETCHING," both filed on Sep. 21, 1995 the same day as this application, and naming M. Rostoker as inventor (both incorporated herein by reference for all purposes) describe improved techniques for forming very deep and narrow trenches for use in trench capacitors. These applications describe plasma etching processes conducted in specialized reactors employing three or more electrodes and special etch conditions which protect trench sidewalls. The three electrodes provide improved control over the plasma uniformity and impact on the substrate. And the sidewall protection provides for a highly anisotropic etch and therefore a very deep and narrow trench. While such techniques represent improvements over the state of the art, it would be highly desirable have other techniques for maintaining the capacitance of trench capacitors as device size and spacing decrease.

SUMMARY OF THE INVENTION

The present invention meets the aforementioned need by providing a process for forming trenches having nonlinear, high surface-area sidewalls. Because such trenches have such high surface-area sidewalls, trench capacitors formed in accordance with this invention provide more capacitance per unit depth than comparable straight-walled trenches. Thus, such trench capacitors can be made very narrow and used in DRAMs having extremely high device densities. In accordance with this invention, nonlinear trench sidewalls may have rounded and/or undulating profiles. Such trenches may be formed by first providing a nonlinear dopant concentration profile in a substrate beneath a region where the trench is to be formed. Then the trench is formed under conditions that selectively attack (or resist) highly doped substrate regions so that the trench sidewalls mirror the dopant concentration profile.

In one aspect, the present invention provides a method of etching a trench in a substrate. The method can be characterized by the following steps: (1) providing one or more impurity regions in the substrate beneath the substrate's top surface to define a vertical concentration profile which is substantially nonlinear; (2) defining an etchant access region on the substrate's top surface above the one or more impurity regions; and (3) providing etchant through the etchant access region to etch a trench such that the resulting trench has one or more sidewalls of substantially nonlinear shape corresponding to the vertical concentration profile. In general, the one or more impurity regions should extend laterally over a first width and the etchant access region should extend laterally over a second width, with the first width being greater than the second width. The resulting trench will thus have a relatively narrow neck region at the substrate surface above a relatively wide body region.

The concentration profile defined by the impurity regions will determine the shape of the trench sidewalls. This is because the etchant is chosen to preferentially etch either the impurity regions or the regions surrounding the impurity regions. In one preferred embodiment, the impurity regions are provided as multiple layers of impurity vertically separated from one another beneath the top surface of the substrate. A subsequent etch performed under conditions which preferentially attack the impurity regions will produce a trench having sidewalls with undulating shapes. In an alternative embodiment, an impurity region is provided as a single rounded region beneath the top surface of the substrate, and a subsequent etch will produce a trench of generally rounded shape (e.g., a ball shape or an hour-glass shape).

In a preferred embodiment, prior to the step of the providing the impurity regions, the method includes a step of forming a first mask which exposes a region on the top surface of the substrate. The impurities are then introduced through the exposed region to form the impurity regions (by, for example, ion implantation). Thus, the exposed region approximately defines the impurity regions' sizes. After the impurities have been introduced, the exposed region is preferably narrowed by providing spacers to define the etchant access region. Thereafter, the trench is etched by, for example, reactive ion etching through the etchant access region.

In another aspect, the present invention provides a semiconductor chip which can be characterized as including (1) a semiconductor substrate having an upper surface; and (2) a trench provided in the substrate and having one or more sidewalls. The trench includes, in turn, (i) a neck region of a defined first width located at the upper surface of the semiconductor substrate, and (ii) a body region located below said neck region in the semiconductor substrate, with the body region having at least one nonlinear region of a second defined width which is greater than the first defined width. In preferred embodiments, the sidewalls will have undulating or rounded shapes. The trenches meeting the above criteria can be used in trench capacitors which have a conformal dielectric layer on the sidewalls, and an electrically conductive material (e.g., polysilicon) provided interior to the trench and adjacent to the conformal dielectric layer. In this design, the semiconductor substrate and the electrically conductive material form plates of a trench capacitor.

A third aspect of the invention provides an integrated circuit incorporating active devices and trench capacitors in a semiconductor substrate. The integrated circuit may be characterized as including the following: (1) a plurality of trench capacitors each having an insulated storage plate within a trench in the semiconductor substrate; and (2) a plurality of active devices arranged in a predefined circuit configuration with at least some of the plurality of trench capacitors. In such integrated circuits, at least some of the trench capacitors are provided in trenches having (i) a neck region of a defined first width located at the upper surface of the semiconductor substrate, and (ii) a body region located below said neck and having at least one nonlinear region of a second defined width which is greater than the first defined width.

The integrated circuits of this invention may be DRAMs which incorporate multiple dynamic memory cells, each of which includes a trench capacitor and a pass transistor connected in series. As noted, this invention allows fabrication of DRAMs having a very high density of such memory cells on a single chip. In preferred embodiments, an integrated circuit of this invention includes at least about 1.5 billion dynamic memory cells (and more preferably about 2 billion such cells) on a monocrystalline silicon substrate. In some cases, the integrated circuits of this invention are provided as part of a digital system having a plurality of semiconductor integrated circuits. For example, the system may be multichip memory module.

These and other features and advantages of the invention will be described in more detail below with reference to the drawings.

DETAILED DESCRIPTION OF THE PREFERRED EMBODIMENTS

Traditionally, trench formation processes have produced trenches having straight (linear) sidewalls. While such structures are relatively easy to prepare, they unfortunately possess the minimal possible surface area available for a trench of given depth. Thus, trench capacitors made from them will have a limited capacitance. The present invention pertains to trenches having high surface-area nonlinear sidewalls which are useful for making high capacitance trench capacitors. Most generally, the present invention covers any trench purposely designed to have a nonlinear sidewall. Two such structures will be described in specific embodiments below, but it should be understood that other nonlinear structures are within the scope of this invention.

As used herein, the term "nonlinear" refers to any structure which is not linear over the distance of a primary dimension. In the case of a trench, the trench depth defines the primary dimension of the trench sidewalls. A sidewall having a profile that substantially deviates from linear along the path from the trench neck to the trench bottom can be characterized as nonlinear. It is recognized that all trench sidewalls will have a certain roughness at the atomic scale—and possibly at higher level scales—simply by virtue of the etching process. Thus, a nonlinear sidewall in the context of this invention will generally deviate from linearity on a scale of at least one-twentieth of the sidewall length. This applies to the length as well as the magnitude of the nonlinearity. For example, if a trench is 4 microns deep, undulations in that sidewall having a periodicity of 0.2 microns or greater and an amplitude of 0.2 microns or greater would render the trench sidewall "nonlinear."

In general, the processes of this invention will include one step of providing one or more impurity regions in a semiconductor substrate and a subsequent step of etching through these layers under conditions chosen to preferentially remove material in either the impurity regions or the substrate surrounding the impurity regions. Thus, the vertical concentration profile of the impurity regions defines the shape of the subsequently etched trench.

Figure 1A:
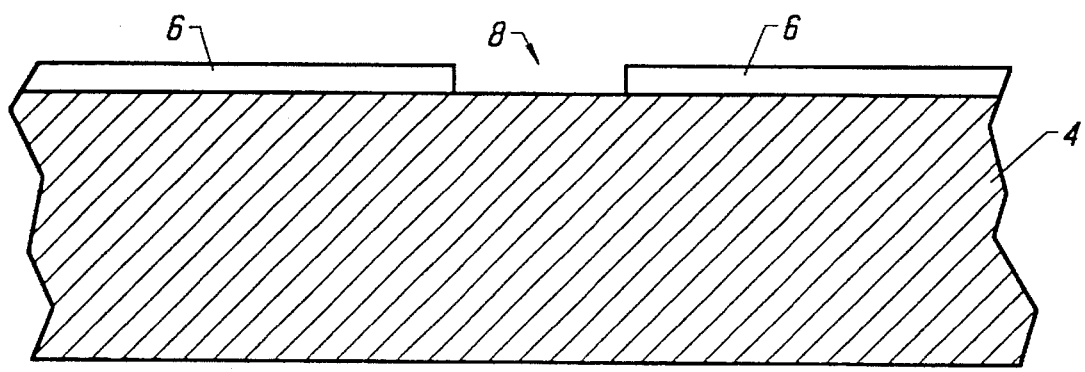
FIG. 1a to 1f are cross-sectional views of a substrate at various stages of a process for forming a trench having undulating sidewalls in accordance with this invention.

A first preferred process of forming a trench having undulating sidewalls is shown in a series of substrate cross-sectional views in FIGS. 1a to 1f. The process begins, as shown in FIG. 1a, with a substrate 4 having on its top surface a mask layer 6 which exposes a well-defined first region 8 of the substrate's top surface. The first region will have a specified width and will be located over a region where a trench is to be subsequently formed. The substrate typically is a single crystal silicon wafer or other semiconductor material in which devices are to be formed. The mask layer may be made of photoresist, silicon oxide, silicon nitride, glass, etc., or alternating layers of any these materials chosen as needed to protect the unexposed substrate from subsequent implantation and etching processes.

Figure 1B:
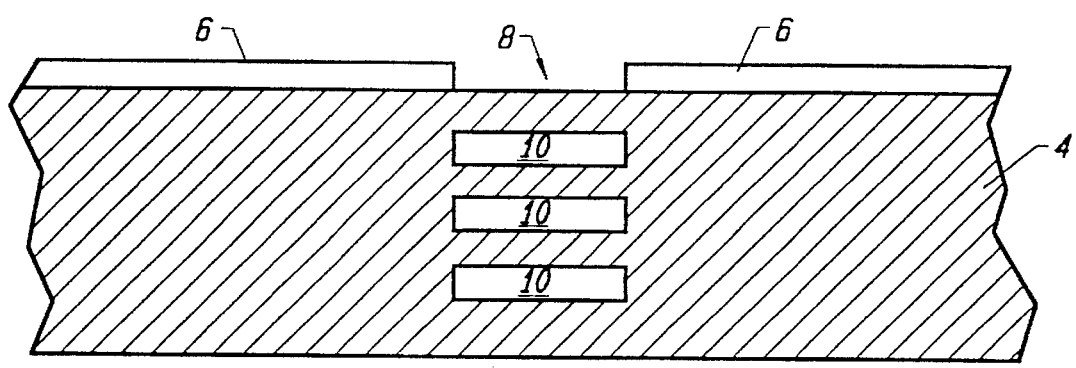

Impurity species are introduced into the substrate by any suitable technique through the exposed first region 8 of the substrate. To make the undulating structure exemplified in this embodiment, ion implantation generally will be employed. As shown in FIG. 1b the impurity species are implanted so as to create one or more layers 10 that alternate with unimplanted substrate material 4. The impurity (or impurities) are chosen to create regions that are more (or less) susceptible to chemical etching in subsequent steps. The exact impurity used will be chosen for use in combination with a specific etchant. As explained in more detail below, possible impurities for implantation include germanium, oxygen ($O_2$), and argon, for example.

In order to provide the structure shown in FIG. 1b, at least three separate implant steps must be performed, each at a different energy (and possibly dose). The depth an implant is primarily dictated by the average energy of the implanted ions. In the example shown, the first implant is conducted at the highest energy and produces the layer 10 farthest removed from the top surface of substrate 4. The second implant is conducted at the second highest energy and produces the middle depth layer 10. Finally, the third implant is conducted at the lowest energy of the three implants and therefore produces the topmost implant layer 10. It should be understood that the thickness and exact profile of any given implant layer can be fine tuned by conducting multiple implants which vary only slightly in energy.

After any or all of the implants are completed, it may be desirable to perform the anneal at temperatures and for lengths of time that promote diffusion for the purpose of expanding the impurity regions. It may further be desirable to perform an anneal step to repair substrate radiation damage resulting from implantation radiation. However, when the selectivity of a subsequent etch relies upon damage to the substrate lattice, it will generally be desirable forego the anneal step.

Figure 1C:
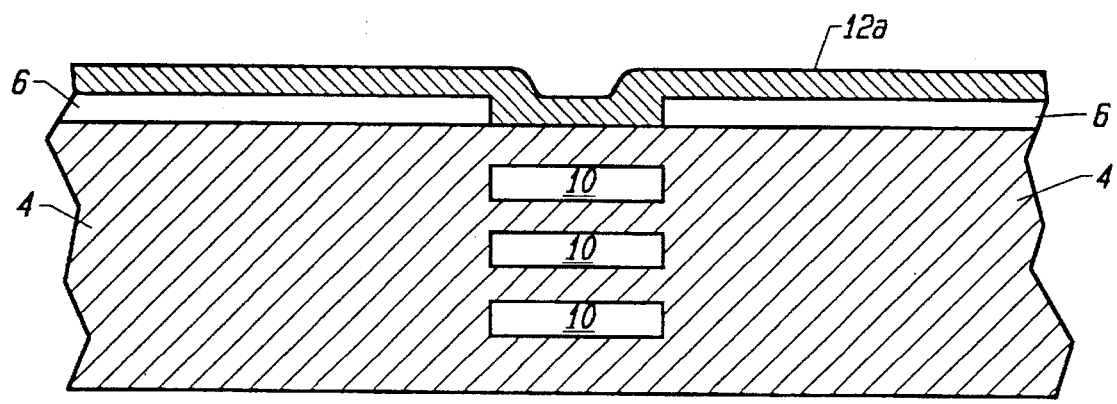
Figure 1D:
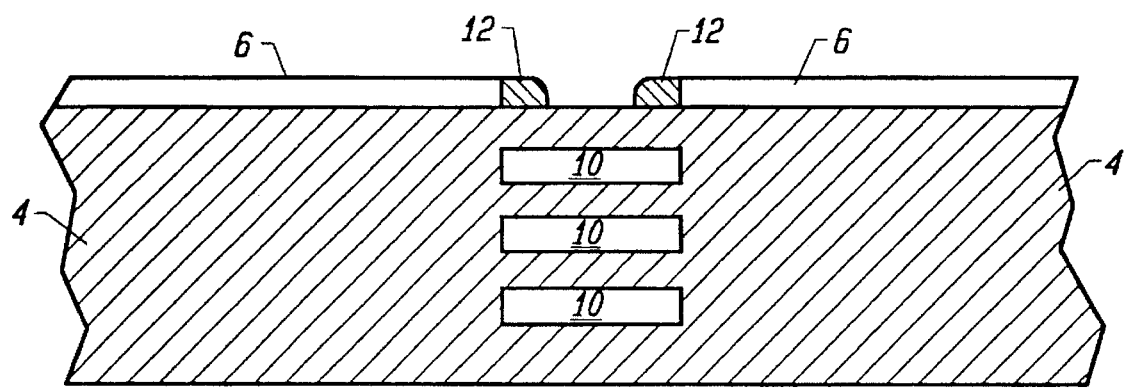

After implantation of the impurity layers 10, a layer 12a of oxide, nitride, glass, or other material suitable for forming spacers is conformally deposited to produce the structure shown in FIG. 1c. Thereafter, substrate 4 is etched away under conditions that remove only enough of layer 12a to expose the top surface of substrate 4 in the vicinity of exposed region 8. This also serves to provide spacers 12 at either edge of exposed region 8 as shown in FIG. 1d. In effect, the width of the exposed region has been narrowed from a first width defined by the original mask 6 to a second width defined by the spacers 12. This second width defines the region of substrate 4 that will be exposed to etchants for the purpose of forming a trench.

Figure 1E:
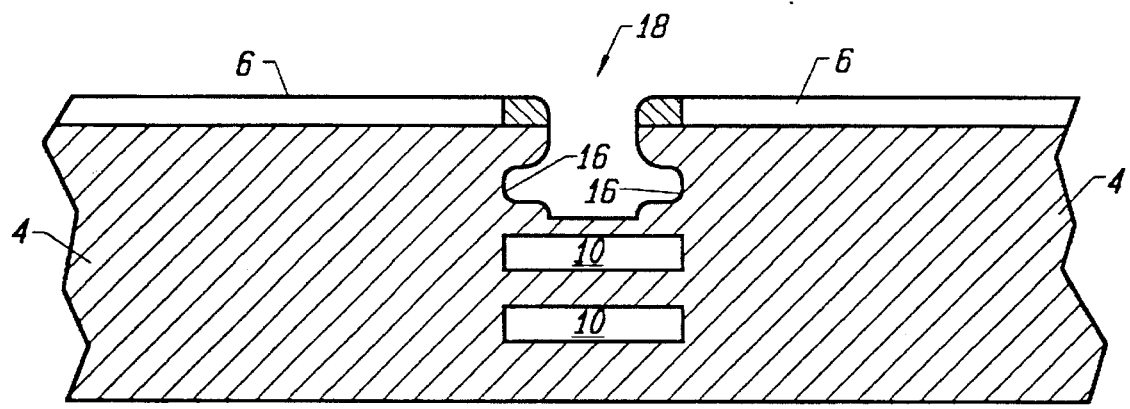
Figure 1F:
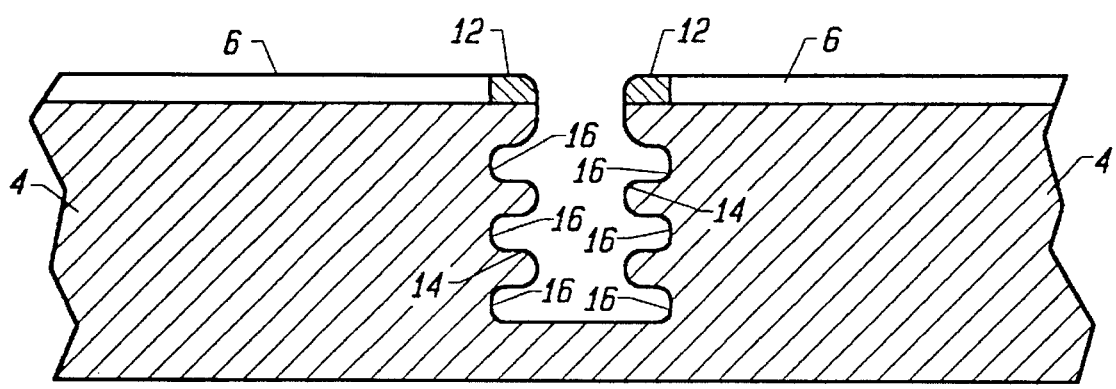

Subsequent anisotropic etching of the exposed substrate forms the trench. Various etching techniques such as reactive ion etching or selective sputter etching may be employed using conventional plasma reactors. Regardless of the technique, the etch chemistry should be chosen to preferentially etch either the impurity-implanted regions or the unimplanted regions. FIG. 1e illustrates the progress of a trench etching process in which the etchant chemistry has been chosen to preferentially etch implanted regions 10. As shown, the preferential etch preferentially removes the impurity-implanted areas with respect to the unimplanted substrate, to form a lateral indentation 16 in the trench sidewalls where the top layer of impurity was implanted. As the etching process continues, each impurity region will be laterally etched in turn. FIG. 1f illustrates a completed trench having three indentations 16 in each trench sidewall 14.

It should be noted that a neck region 18 is formed near the top of the trench, above the implanted regions 10. Because neck region 18 lies above the implanted regions 10, it is not preferentially etched and therefore is somewhat narrower than the indentations 16. As used herein, the neck region of a trench generally refers to a narrow section of the trench at the top of the substrate adjacent to the mask. Further, a body region of the trench refers to the region below the neck region and generally includes nonlinear features of the trench.

The process depicted in FIGS. 1a to 1f shows that the exposed region through which the impurities are implanted is somewhat larger than the exposed region through which the dry trench etching is conducted. This serves two purposes. It allows the trench to have a substantially nonlinear profile and it allows the trench to occupy relatively little area on the top surface of the substrate.

The impurity regions (implanted through the larger exposed region) extend beyond the sidewalls of an ideal anisotropically etched trench (etched through the smaller exposed region). The impurity regions lying beyond these ideal sidewalls are more susceptible to lateral etching than the other regions lying beyond the sidewalls. Thus, some nonlinearity (high surface area) is introduced in the trench sidewalls. If the impurity implant and trench etch exposed regions were to be identical in size, the resulting trench sidewalls would be substantially straight.

In addition, the relatively narrow trench etch exposed region forms a trench with a narrow neck. Most of the wider nonlinear trench features lie below the substrate surface. This allows the trench to occupy only a relatively small region of the substrate top surface. Thus, more area is free to form other trenches and devices in high density chips.

As noted, various combinations of impurity and etchant may be employed to promote nonlinear etching in the present invention. In one example, argon ions are implanted in a monocrystalline silicon substrate to form the impurity regions. As argon is substantially chemically inert, the mere presence of argon ions in the impurity region will not significantly increase the reactivity of the impurity regions. However, if the argon is implanted at an energy and in a dose sufficient to significantly damage or otherwise alter the silicon crystal lattice, the altered regions can be preferentially attacked. This is because, in general, the etch rates for a radiation-damaged silicon lattice will be considerably faster than those for an intact crystalline silicon lattice. Thus, the dry etch employed to form the trench may produce the desired nonlinear shape.

In an alternative embodiment, the impurity and etch chemistry combination are chosen such the regions outside of the impurity regions are preferentially etched. Thus, the resulting trench will have a body region in which constrictions correspond to the locations of the impurity. In one such example, the impurity regions 10 include a locally increased concentration of oxygen. Such oxygen may be provided by for example implantation of oxygen ions using conventional ion implantation apparatus. The implanted oxygen will form some silicon oxide (in a silicon substrate), but not necessarily a stoichiometric $SiO_2$. In a subsequent etch with etchant species that preferentially attack silicon with respect to silicon oxides, the regions of high oxygen concentration (i.e., the impurity regions) are etched away more slowly than the surrounding regions of silicon. Various etch chemistries that preferentially attack silicon over silicon oxide are known in the art. One such chemistry includes $CF_4$ and $O_2$, with higher $O_2$ concentrations providing more preference for silicon etching.

In other alternative embodiments, the impurity and etch chemistry combination may be chosen such that the dry trench etch attacks the silicon and impurity regions at about equal speed. Thus, the etch will produce an intermediate straight-walled trench through the impurity regions. Thereafter, a second etch preferentially removes the residual impurity-implanted regions at the sidewalls of the trench. Depending the impurity material employed, the second etch step might be a wet chemistry etch using potassium hydroxide (KOH), for example. The resulting trench would then have the desired nonlinear shape as defined by the impurity concentration profile. This, of course, assumes that the width of the impurity regions exceeds that of the intermediate trench so that the edges of the impurity regions remain in the substrate beyond the trench sidewalls.

In one example, argon ions are implanted in a monocrystalline silicon substrate which is subsequently dry etched as described above. While the dry etch conditions may preferentially etch the radiation damaged regions, they may do so only to a limited extent. Any deviations from linearity may be accentuated by a subsequent wet etch step chosen to preferentially attack the damaged regions of the substrate. One such wet etchant is a solution of aqueous potassium hydroxide.

In another example, the germanium ions are implanted in a silicon substrate to form germanium regions. Next, a non-preferential anisotropic etch, such as a non-selective sputter etch, is employed to form an intermediate trench having straight sidewalls with residual edges of the germanium regions extending beyond the sidewalls into the substrate. The residual germanium regions are then oxidized by exposing the trench to an oxidizing environment. The resulting germanium oxides (e.g., $GeO_2$ and/or $GeO$) are somewhat soluble in water or dilute acid or base solutions. This property is exploited in a subsequent etch step in which the straight trench sidewalls are exposed to an aqueous solvent for the germanium oxide. As a result, the germanium oxide is removed from the impurity regions to provide the desired nonlinear shape.

The above discussion has focused on the case in which multiple layers or strata of impurities are implanted in a substrate to provide the nonlinear trench shape. However, it is also possible to produce high surface area trenches from substrates provided with only a single impurity region. The resulting trench might have for example a substantially globe or hour-glass shape.

Figure 2A:
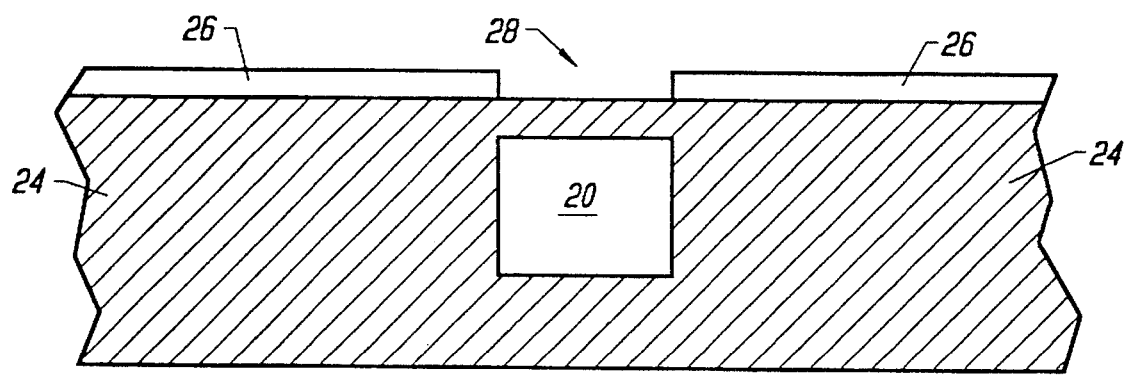
FIGS. 2a and 2c are cross-sectional views of a substrate at various stages of a process for forming a trench having rounded sidewalls in accordance with this invention.
Figure 2B:
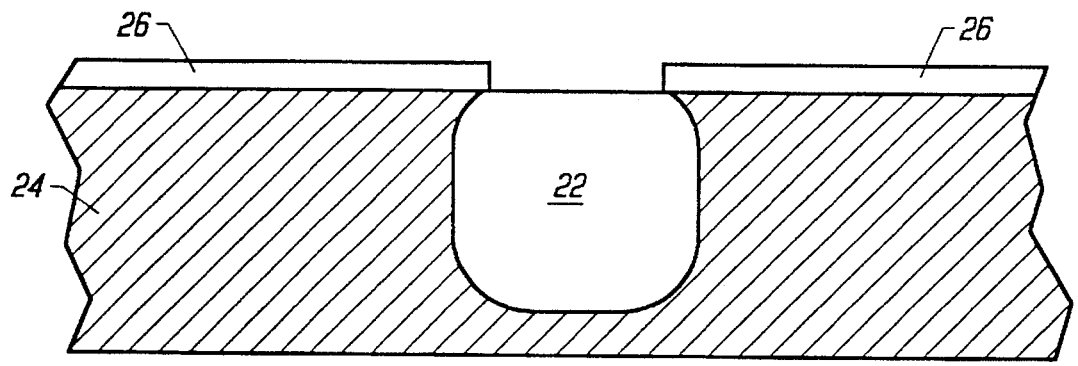

A process for preparing a rounded generally globe shaped trench region will now be described with reference to FIGS. 2a to 2c. Initially, a single impurity region 20 is implanted in a substrate 24 through an exposed region 28 of a mask 26 as shown in FIG. 2a. As in the previous embodiment, the impurity region extends laterally to approximately the edge of the exposed region 28. Unlike the previous embodiment, however, the implant extends over a significant vertical distance. Such effect can be accomplished by, for example, performing multiple implants at slightly differing energies. After the impurity region 20 has been formed, the substrate 24 is subjected to a diffusion anneal in which impurity species diffuse outwardly to give the generally rounded profile associated with diffused region 22 in FIG. 2b. Finally, a trench 28 is etched through exposed region 28 under conditions which preferentially attack the impurity region. The resulting structure is shown in FIG. 2c.

Figure 2C:
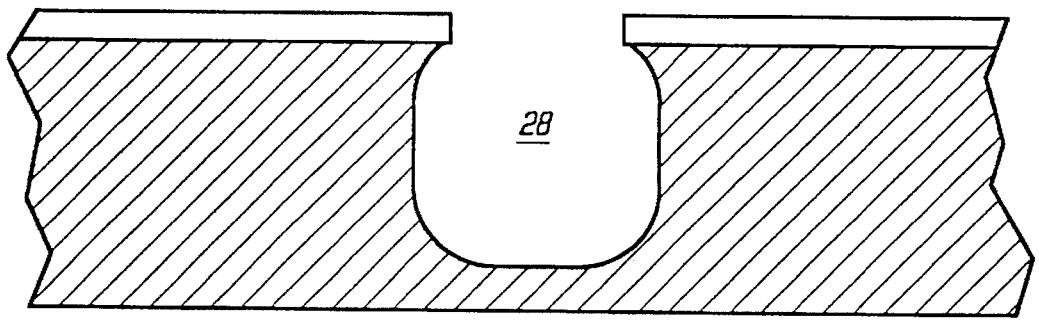

The body region shown in FIG. 2c is completely rounded. In alternative embodiments, however, the trench may have straight vertical sidewalls near the substrate upper surface (neck). Such structure could be obtained by performing implants at high energies or limiting the diffusion of impurity species from region 20 so that region 22 does not reach the top of substrate 24.

Other trench shapes are within the scope of this invention. In general, triangular and other polygonal shapes may be formed using the principles described above. In general, the trench shape can be made to conform to the impurity region's shape. The impurity region shape can be controlled by selectively performing multiple implant and diffusion steps. Generally, increasing implant energies results in increasingly deep impurity regions. Further, increasing implant dosages results in wider vertical implant profiles. Finally, increasing time and temperature of diffusion anneals results in increasingly spread out impurity regions.

In a DRAM, a trench capacitor forms part of a single memory cell that also includes an active device such as an MOS transistor. More specifically, a memory cell typically includes one of said trench capacitors and a pass transistor connected in series. Multiple memory cells are arranged in a predefined circuit configuration to form the DRAM. Specifically, in each cell, the transistor's gate is connected to a word line, one transistor drain/source is connected to a first plate of the trench capacitor (e.g., the semiconductor substrate), and the other drain/source is connected to a bit line. Using the methods and apparatus of this invention to form nonlinear trenches with narrow neck regions, many high-capacitance trench capacitors can be formed on small substrate area. In accordance with this invention, the trench capacitors are provided in trenches having (i) a neck region of a defined first width located at the upper surface of the semiconductor substrate, and (ii) a body region located below the neck region in the semiconductor substrate, with the body region having at least one nonlinear region of a second defined width which is greater than said first defined width. Such devices may be formed on a single DRAM chip capable of storing at least one gigabit of data. For example, using trench capacitors of this invention, a 1.5–2 gigabit DRAM could be provided on a single monocrystalline silicon chip. In some cases, the DRAMs or other integrated circuits prepared in accordance with this invention are provided as part of a digital system having a plurality of semiconductor integrated circuits. For example, the system may be multichip memory module.

Figure 3:
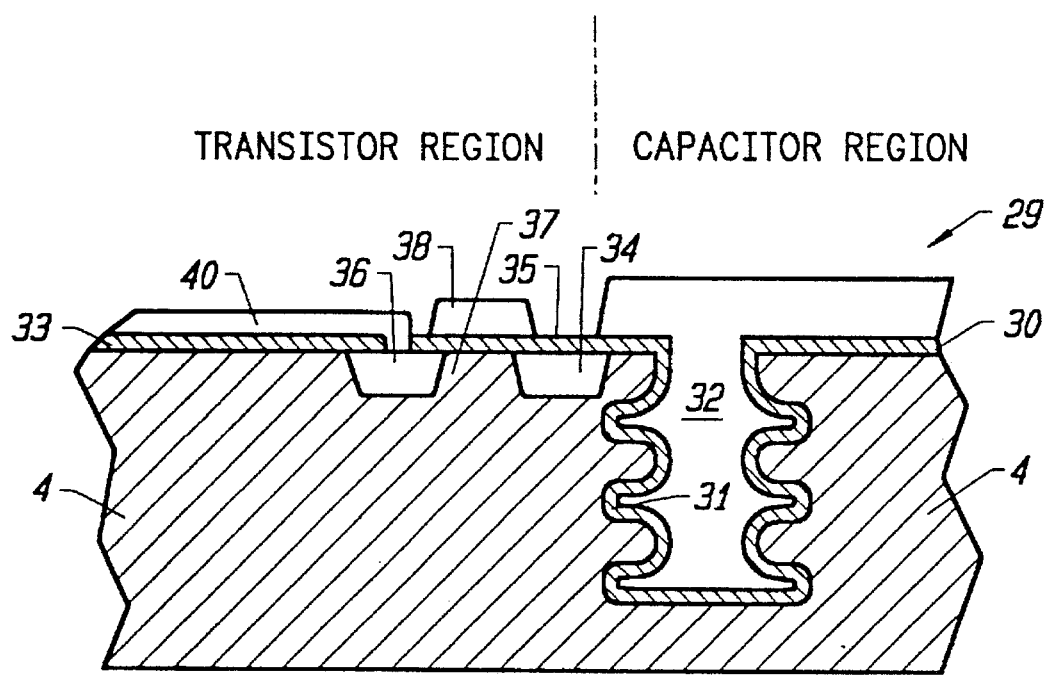
FIG. 3 is a cross-sectional view of a trench capacitor cell formed from a trench having undulating sidewalls as shown in FIG. 1f.
Figure 4:
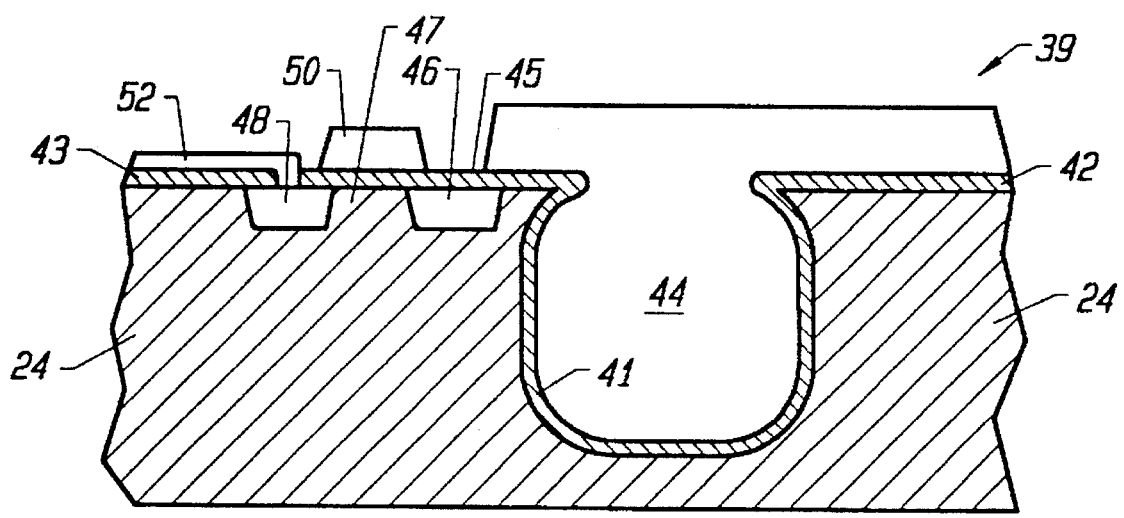
FIG. 4 is a cross-sectional view of a trench capacitor cell formed from a trench having rounded sidewalls as shown in FIG. 2c.

Trench capacitor DRAM cells formed from undulating and rounded trenches of this invention are illustrated in FIGS. 3 and 4 respectively. As shown in FIG. 3, a cell 29 includes a capacitor region and a transistor region formed in single crystal semiconductor substrate 4. The capacitor region includes a layer of oxide 31 or other dielectric conformally deposited on an undulating trench sidewall (see e.g. FIG. 1f). The region of substrate 4 lying immediately beyond the dielectric layer 31 forms one plate of the trench capacitor. A plug of polysilicon 32 fills the trench and forms a second plate of the trench capacitor. Typically, the polysilicon plate is connected to ground and the substrate plate is electrically connected to the transistor. Beyond the trench, a layer of dielectric 30 electrically insulates the polysilicon plate 32 from the substrate 4.

The substrate plate of the trench capacitor is coupled to a first source/drain 34 of an MOS transistor. Other features of the MOS transistor include a gate electrode 38 separated from a channel region 37 by a gate dielectric 35. A second source/drain 36 is provided in substrate 4 and separated from first source/drain 34 by channel region 37. Both first and second source/drain regions 34 and 36 have a conductivity type opposite that of substrate 4. The source/drain regions will change function from source to drain or vice-versa depending upon whether the DRAM cell is being read from or written to. The source/drain region 36 is connected to a bitline 40 which is insulated from substrate 4 by a dielectric layer 33. The gate electrode is connected to a word line (not shown) which extends in a direction normal to the plane of the Figure.

A similar DRAM cell 39 for a rounded trench capacitor is shown in FIG. 4. The cell 39 again includes a capacitor region and an MOS transistor region formed in single crystal semiconductor substrate 24. The capacitor region includes a dielectric layer 41 provided on a rounded trench sidewall (see e.g. FIG. 2c). A plug of polysilicon 44 fills the trench to form a plate of the trench capacitor. Beyond the trench, a layer of dielectric 42 electrically insulates the polysilicon plate 44 from the substrate 24.

The MOS transistor includes a first and second source/drain regions 46 and 48, a gate electrode 50 separated from a channel region 47 by a gate dielectric 45. The source/drain region 48 is connected to a bitline 52 which is insulated from substrate 24 by a dielectric layer 43. As before, the gate electrode is connected to a word line (not shown) which would extend normal to the plane of the Figure.

Although a few preferred embodiments of the present invention have been described in detail, it should be understood that the present invention may be embodied in many other specific forms without departing from the spirit or scope of the invention. Particularly, it should be understood that nonlinear trenches may be etched in materials other than semiconductor substrates. For example, the principles of this invention can be applied to forming nonlinear cuts in oxides, glasses, or other dielectrics to form e.g. vias. In addition, the exact sizing, shaping, and placement of the nonlinear regions of a trench may be widely varied within the scope of the present invention. Further, the exact materials provided beneath the substrate surface in order to provide a nonlinear concentration profile can be varied within the scope of this invention. Therefore, the present embodiments are to be considered as illustrative and not restrictive, and the invention is not to be limited to the details given herein, but may be modified within the scope of the appended claims.

What is claimed is:

1. A method of etching a trench in a substrate having a top surface, the method comprising the following steps:

providing one or more impurity regions in the substrate beneath the top surface of said substrate, said one or more impurity regions laterally extending over a first width and defining a vertical concentration profile which is substantially nonlinear;

defining an etchant access region of specified second width on said top surface above the one or more impurity regions, said second width being narrower than said specified first width; and providing etchant through said etchant access region to etch said trench such that said trench has one or more sidewalls of substantially nonlinear shape corresponding to said vertical concentration profile.

2. The method of claim 1 wherein the step of providing one or more impurity regions provides multiple layers of impurity vertically separated from one another beneath the top surface of the substrate.

3. The method of claim 2 wherein the one or more trench sidewalls formed by said step of providing etchant have undulating shapes.

4. The method of claim 1 wherein the step of providing one or more impurity regions provides a Single region of generally rounded shape disposed beneath the top surface of the substrate.

5. The method of claim 4 wherein one or more trench sidewalls formed by said step of providing etchant have a rounded shape.

6. The method of claim 1 further comprising a step of forming a first mask on said top surface prior to said step of providing one or more impurity regions, said first mask defining a first exposed region of width comparable to said first width, wherein impurities are introduced through said first exposed region to form said impurity regions.

7. The method of claim 6 further comprising a step of providing a second exposed region which defines said etchant access region.

8. The method of claim 7 wherein the step of providing a second exposed region includes a substep of forming spacers on the first mask at edges of the first exposed region so that the first exposed region is narrowed to the second exposed region.

9. The method of claim 1 wherein the step of providing one or more impurity regions includes a step of providing germanium to the substrate to form said impurity regions.

10. The method of claim 9 wherein the step of providing etchant through said etchant access region forms a temporary trench having substantially straight sidewalls, and wherein said step of providing etchant is followed by the following steps:

converting germanium to germanium oxide in regions adjacent to said substantially straight sidewalls, and removing said germanium oxide to form said one or more sidewalls of substantially nonlinear shape.

11. The method of claim 1 wherein the step of providing one or more impurity regions includes a step of providing oxygen to the substrate to form said impurity regions, whereby said impurity regions contain a silicon oxide.

12. The method of claim 11 wherein the step of providing etchant through said etchant access region provides an etchant which preferentially etches either silicon or silicon oxide to form said one or more sidewalls of substantially nonlinear shape.

13. The method of claim 1 wherein the step of providing one or more impurity regions includes a step of implanting inert ions in said substrate under conditions which alter a crystalline structure of the substrate.

14. The method of claim 13 wherein the step of providing etchant through said etchant access region provides an etchant which preferentially etches substrate regions that have been formed by said step of implanting inert ions.

15. A method of forming a trench capacitor in a substrate having a top surface, the method comprising the following steps:

providing one or more impurity regions in the substrate beneath the top surface of said substrate, said one or more impurity regions laterally extending over a first width and defining a vertical concentration profile which is substantially nonlinear;

defining an etchant access region of specified second width on said top surface above the one or more impurity regions, said second width being narrower than said specified first width;

providing etchant through said etchant access region to etch a trench such that said trench has one or more sidewalls of substantially nonlinear shape corresponding to said vertical concentration profile; and forming a dielectric layer on said one or more sidewalls.

16. The method of claim 15 further comprising a step of filling the trench with a conductive plug after said step of forming a dielectric layer.

17. The method of claim 15 wherein the step of providing one or more impurity regions provides multiple layers of impurity vertically separated from one another beneath the top surface of the substrate.

18. The method of claim 17 wherein the one or more trench sidewalls formed by said step of providing etchant have undulating shapes.

19. The method of claim 15 wherein the step of providing one or more impurity regions provides a single region of generally rounded shape disposed beneath the top surface of the substrate.

20. A semiconductor chip comprising:
a semiconductor substrate having an upper surface; and
a trench provided in said substrate and having one or more sidewalls, said trench including,
a neck region of a first width located at said upper surface of the semiconductor substrate, and
a body region located below said neck region in the semiconductor substrate, wherein said body region has at least one nonlinear region of a second width which is greater than said first width.

21. The semiconductor chip of claim 20 wherein said one or more sidewalls has an undulating shape.

22. The semiconductor chip of claim 20 wherein said one or more sidewalls has a substantially rounded shape.

23. The semiconductor chip of claim 20 further comprising:
a conformal dielectric layer on said one or more sidewalls of said trench; and
an electrically conductive material provided interior to said trench and adjacent to said conformal dielectric layer, whereby said semiconductor substrate and said electrically conductive material form plates of a trench capacitor.

24. A semiconductor memory chip comprising:
a semiconductor substrate having an upper surface;
a trench provided in said substrate and having one or more sidewalls, said trench including,
a neck region of a first width located at said upper surface of the semiconductor substrate, and
a body region located below said neck region in the semiconductor substrate, wherein said body region has at least one nonlinear region of a second width which is greater than said first width; and
an electrically conductive material provided interior to said trench and adjacent to said conformal dielectric layer, whereby said semiconductor substrate and said electrically conductive material form plates of a trench capacitor.

25. The semiconductor chip of claim 24 wherein said one or more sidewalls has an undulating shape.

26. The semiconductor chip of claim 24 wherein said one or more sidewalls has a substantially rounded shape.

27. An integrated circuit incorporating active devices and trench capacitors in a semiconductor substrate having a top surface, the integrated circuit comprising:
a plurality of trench capacitors each having an insulated storage plate within a trench in the semiconductor substrate; and
a plurality of active devices arranged in a circuit configuration with at least some of said plurality of trench capacitors,
wherein at least some of the trench capacitors are provided in trenches having (i) a neck region of a first width located at said upper surface of the semiconductor substrate, and (ii) a body region located below said neck region in the semiconductor substrate, wherein said body region has at least one nonlinear region of a second width which is greater than said first width.

28. The integrated circuit of claim 27 wherein said trench body regions have an undulating shape.

29. The integrated circuit of claim 27 wherein said trench body regions have a rounded shape.

30. The integrated circuit of claim 27 wherein the integrated circuit is a dynamic random access memory comprised of dynamic memory cells, each of which includes one of said trench capacitors and a pass transistor connected in series.

31. The integrated circuit of claim 30 wherein the integrated circuit includes at least about 1.5 billion dynamic memory cells on said semiconductor substrate which semiconductor substrate is monocrystalline silicon.

32. The integrated circuit of claim 31 wherein the integrated circuit includes at least about 2 billion dynamic memory cells on said semiconductor substrate which semiconductor substrate is monocrystalline silicon.

33. A digital system having a plurality of semiconductor integrated circuits, each incorporating active devices and trench capacitors in a semiconductor substrate having a top surface, the digital system comprising:
a plurality of integrated circuits each including
a plurality of trench capacitors each having an insulated storage plate within a trench in the semiconductor substrate; and
a plurality of active devices arranged in a circuit configuration with at least some of said plurality of trench capacitors,
wherein at least some of the trench capacitors are provided in trenches having (i) a neck region of a first width located at said upper surface of the semiconductor substrate, and (ii) a body region located below said neck region in the semiconductor substrate, wherein said body region has at least one nonlinear region of a second width which is greater than said first width.

34. The digital system of claim 33 wherein the integrated circuits are DRAMs and the digital system is a multichip memory module.

35. The digital system of claim 33 wherein said trench body regions have an undulating shape.

36. The digital system of claim 33 wherein said trench body regions have a rounded shape.

37. The digital system of claim 33 wherein at least one of the integrated circuits includes at least about 1.5 billion dynamic memory cells on said semiconductor substrate which semiconductor substrate is monocrystalline silicon.

* * * * *